United States Patent [19]

Atsumi et al.

[11] Patent Number: 4,924,339
[45] Date of Patent: May 8, 1990

[54] INPUT PROTECTING CIRCUIT IN USE WITH A MOS SEMICONDUCTOR DEVICE

[75] Inventors: Shigeru Atsumi, Tokyo; Toru Yoshida; Yasuo Kawahara, both of Kawasaki; Fuminari Tanaka, Tokyo, all of Japan

[73] Assignee: Kabushiki Kaisha Toshiba, Kawasaki, Japan

[21] Appl. No.: 291,476

[22] Filed: Dec. 28, 1988

[30] Foreign Application Priority Data

Jan. 11, 1988 [JP] Japan .................................. 63-3612

[51] Int. Cl.$^5$ .............................................. H02H 9/04
[52] U.S. Cl. ........................................ 361/56; 361/58; 361/91; 361/111; 357/23.13
[58] Field of Search .................... 361/58, 91, 111, 56; 357/23.13, 46

[56] References Cited

U.S. PATENT DOCUMENTS

| | | | |
|---|---|---|---|
| 3,676,742 | 7/1972 | Russell et al. | 357/23.13 |
| 3,819,952 | 6/1974 | Enomoto et al. | 361/56 |
| 4,066,918 | 1/1978 | Heuner et al. | 361/91 X |
| 4,282,556 | 8/1981 | Ipri | 361/111 X |
| 4,692,834 | 9/1987 | Iwahashi et al. | 361/56 X |
| 4,760,433 | 7/1988 | Young et al. | 357/42 |

FOREIGN PATENT DOCUMENTS 60-207383 10/1985 Japan .

OTHER PUBLICATIONS

"NMOS Protection Circuitry", IEEE Transactions on Electron Devices, vol. ED-32, No. 5, May 1985, R. Rountree and Charles L. Hutchins.

*Primary Examiner*—Todd E. DeBoer
*Attorney, Agent, or Firm*—Finnegan, Henderson, Farabow, Garrett and Dunner

[57] ABSTRACT

A bipolar transistor for clamping an excess input potential is provided near an input pad. A signal from the input pad is supplied through a wire to the gate of a MOS transistor in the input stage. A diode is provided near the gate of the MOS transistor. The diode absorbs a potential oscillation generated in the wire near the gate of the transistor, which is due to action of an inductance involved in the wire.

18 Claims, 6 Drawing Sheets

INPUT PROTECTING CIRCUIT IN USE WITH A MOS SEMICONDUCTOR DEVICE

BACKGROUND OF THE INVENTION

1. Field of the Invention

The present invention relates to an input protecting circuit in use with a MOS semiconductor device for protecting a gate insulating film of a transistor contained in an input stage from a high voltage noise.

2. Description of the Related Art

One of the major problems in the IC device, which frequently arises after a manufactured IC chip is packaged, is a breakdown due to ESD (Electric Static Discharge). This is a gate breakdown phenomenon caused through a occurrence that when a charged object such as a human body or mechanical object makes contact with an external pin or pins of the packed IC, charges flow from the object to the inside of the IC package, and consequently a high voltage is applied to the gate of the MOS transistor in the input state of the IC semiconductor circuit, and possibly damages the gate of the transistor. To protect the gate from excessive stress, some measure must be taken to clamp the voltage applied to the gate.

Figures 1, 2:
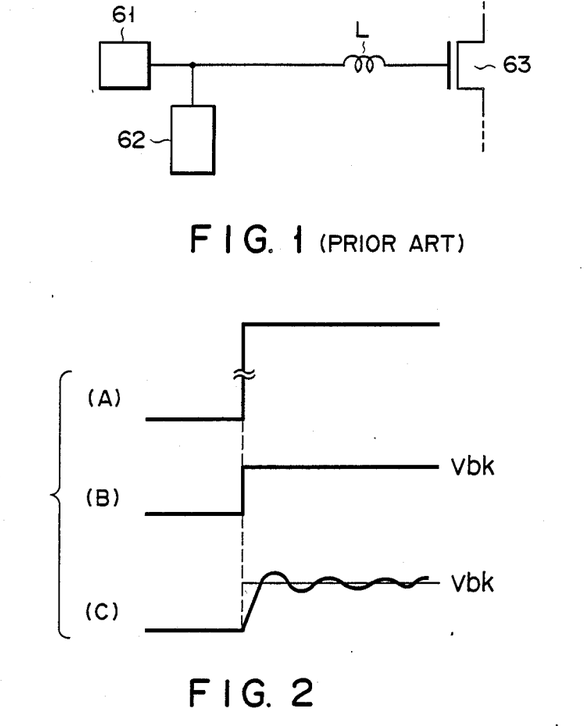
FIG. 1 is a circuit diagram showing a part of a conventional MOS semiconductor device with an input protecting circuit, which illustrates the interrelation of the protecting circuit and the semiconductor circuit.
FIG. 2 is a set of waveforms showing voltages in the circuit of FIG. 1.

A typical measure thus far taken is to place protecting element 62 of a diode or a bipolar transistor, for example, near and in connection with input pad 61 connected to an external pin (not shown) of an IC package, as shown in FIG. 1. Provision of protecting element 62 clamps an excessively high or surge voltage applied to input pad 61, and inhibits the surge voltage from traveling and reaching MO transistor 63 in the input stage. Thus, the protecting element is located near the input pad. The reason for this is that the protecting element may operate as a latch-up generating source, for example, to adversely influence the internal circuit, and hence the protecting element must be located apart from the internal circuit to such an extent that it has little adverse effect on the internal circuit.

For the thick gate oxide film of the MOS transistor 63, the above protecting circuit satisfactorily functions. In a recent trend of thinner oxide films, the conventional protecting circuit is frequently nonfunctional. This will be described in detail by using a specific example. In the circuit of FIG. 1, let us consider a case that protecting element 62 is an aluminum field transistor (equivalent to a bipolar transistor) of which the channel width is 500 μm, and the interval between the source and drain diffusion regions, 2.4 μm, and the gate oxide film of MOS transistor 63 in the input stage is 250 Å thick. In this case, a breakdown voltage at the pn junction of this transistor is approximately 15 V. If it is clamped at approximately 15 V, an electric field applied to the gate of the MOS transistor in the input stage is 6 MV/cm at most. There is no danger that such an electric field will break down the gate.

The EIAJ Standard for the ESD evaluation method has gradually been replaced by the MIL Standard. The evaluation conditions (100 pF, 1.5 kilo ohms) under the MIL Standard was applied for evaluating the conventional protecting circuit. In the evaluation, when a voltage of approximately ±1400 V was applied to input pad 51, gate breakdown was observed. When the applied voltage is positive in polarity, the electric field applied to the gate is 6 MV/cm. When it is negative, the applied electric field is much smaller than the former and gate breakdown cannot occur. Nevertheless, gate breakdown was actually observed for both the positive and negative voltages applied. No one has exactly explicated the cause of this phenomenon. We reason that the inductance component involved the probably makes a great contribution to the gate breakdown. This will be described below. Normally, aluminum wire of several mm in length exists ranging from the protecting element placed near the input pad inside the IC to the internal circuit. The wire has inductance L of approximately several tens nH.

It is assumed now that an ESD stress is applied to an external pin (not shown), and a high voltage noise as shown in FIG. 2(A) is applied to the input pad. Under this condition, a potential near the wire connecting to protecting element 62 is clamped at the breakdown voltage Vbk of protecting element 62, as shown in FIG. 2(B). When the potential stepwise or abruptly changes in this way, inductance L acts so that the potential of the wire near the gate of MOS transistor 63 oscillates as shown in FIG. 2(C). During the oscillation, the potential applied to the gate instantaneously exceeding the clamped voltage by the protecting element repeatedly appears. The excess potentials repeatedly cause stress in the gate oxide film, finally resulting in gate breakdown.

SUMMARY OF THE INVENTION

Accordingly, an object of the present invention is to provide an input protecting circuit in use with a MOS semiconductor device which has a satisfactorily high ESD breakdown voltage, and is available for present and coming MOS semiconductor devices whose gate oxide films are thin.

To achieve the above object, there is provided an input protecting circuit in use with a MOS semiconductor device comprising: an input pad; a MOS transistor in the input stage of the MOS semiconductor device, the gate of which receives a signal from said input pad; a wire interconnecting said input pad and the gate of said MOS transistor in said input stage; a first protecting element provided near said input pad and connected at one end to said interconnecting wire; and a second protecting element provided near the gate of said MOS transistor and connected at one end to said interconnecting wire.

DETAILED DESCRIPTION OF THE PREFERRED EMBODIMENTS

The present invention will be described in detail by using some specific embodiment with reference to the accompanying drawings.

Figure 3:
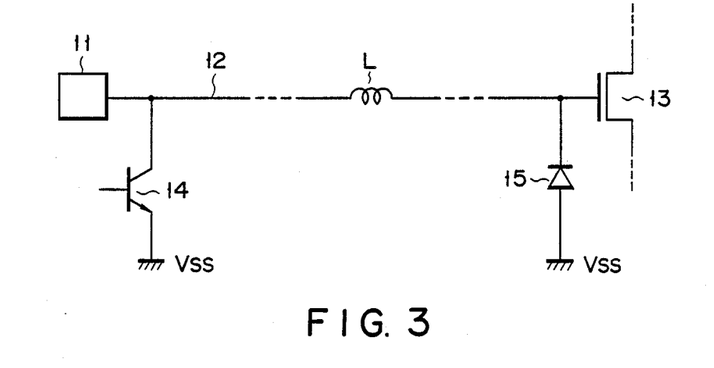
FIG. 3 is a circuit diagram showing a first embodiment of an input protecting circuit according to the present invention.

FIG. 3 is a circuit diagram schematically showing an arrangement of a first embodiment of an input protecting circuit according to the present invention. In the figure, input pad 11, connected to an input pin (not shown) is connected to the gate of MOS transistor 13 in the input stage of a MOS semiconductor device, through interconnection wire 12 made of aluminum. A point of wire 12 close to input pad 11 is connected to the collector of npn bipolar transistor 14 serving as a first protecting element. The emitter of this transistor 14 is connected to ground potential Vss. Another point of wire 12 close to the gate of MOS transistor 13 is connected to the cathode of pn junction diode 15 serving as a second protecting element. The anode of this diode 15 is connected to ground potential Vss. Interconnection wire 12 contains inductance L, which is equivalently expressed in the illustration.

In the circuit thus arranged, if a stress due to the ESD is applied to the input pin of the IC coupled with input pad 11, most of the energy injected into input pad 11 flows toward each potential via bipolar transistor 14. This operation is similar to that of the conventional circuit shown in FIG. 1. As already referred to, it would be surmised that the breakdown of the gate insulating film in a conventional circuit is due to the inductance L of the interconnection wire. In other words, an extremely high potential stress, though the energy of it is small, applied to the gate oxide film of the MOS transistor in the input stage, results in breakdown of the gate oxide film.

To cope with this, in the present embodiment, pn junction diode 15 serving as another protecting element is additionally provided near the gate of MOS transistor 13. This diode clamps the excess voltage applied to the gate of MOS transistor 13. As a result, the gate oxide film of the MOS transistor will never be breakdown even though it is very thin. The ESD breakdown voltage is thus improved.

Most of the energy injected into the input pad 11 is first shunted through transistor 14, and then the remaining energy, which is small but large in potential, reaches diode 15 through interconnection wire 12. Therefore, diode 15 as the second protecting element, which has a smaller chip area, can satisfactorily deal with such remaining energy. Further, there is no occurrence of latch-up in the internal circuit, even with the provision of this diode 15.

Figure 4:
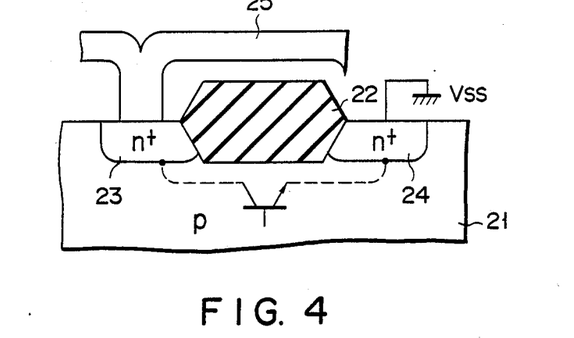
FIG. 4 is a sectional view showing a first protecting element in the first embodiment.

FIG. 4 is a sectional view showing a part of the structure of a bipolar transistor 14, which is used in the embodiment as mentioned above. An IC chip uses p-type silicon substrate 21. A pair of n+ type diffusion regions 23 and 24 are formed in the surface region of the substrate 21, with field oxide film 22 interposed therebetween. Diffusion region 23 is connected to wire 25, which is made of aluminum and connected to interconnection wire 12. This wire 25 extends over field oxide film 22. Another diffusion region 24 is connected to ground potential Vss by means of a wire (not shown). The element thus arranged is generally called an aluminum field transistor, and operates as a bipolar transistor in which n+ diffusion regions 23 and 24 respectively are used for the collector and emitter, and p type substrate 21 for the base.

Figure 5:
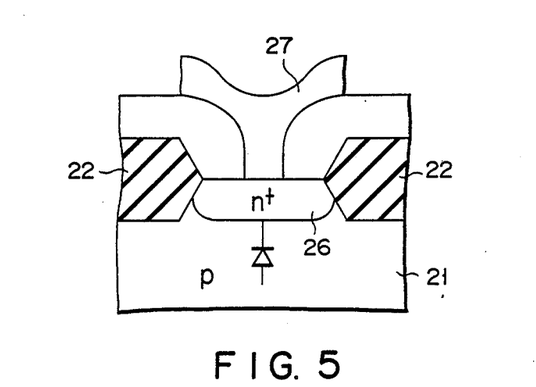
FIG. 5 is a sectional view showing a second protecting element in the first embodiment.

FIG. 5 is a sectional view showing in detail the structure of a pn junction diode 15, which is used as the second protecting element in the embodiment as mentioned above. Also in this structure, an IC chip uses p-type silicon substrate 21. An n+ type diffusion region 26 is formed in the surface region of the substrate 21, which is enclosed by field oxide film 22. This diffusion region 26 is connected to wire 27, which is made of aluminum and connected to interconnection wire 12. The pn junction diode 15 is constructed such that n+ type diffusion region 26 is used for the cathode, and p-type substrate 21 for the anode.

Figure 6:
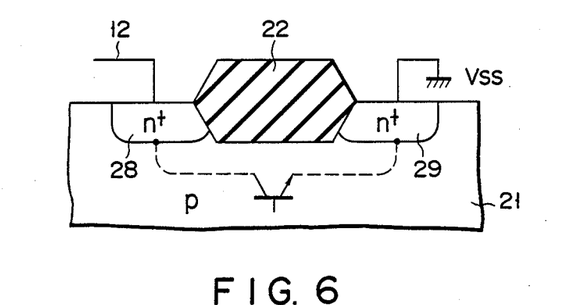
FIG. 6 is a sectional view showing a first protecting element in the first embodiment.
Figure 7:
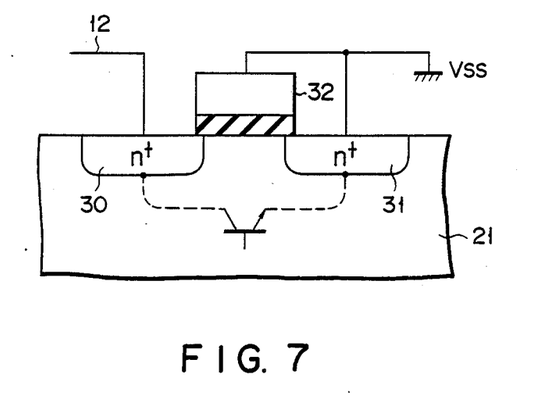
FIG. 7 is a sectional view showing a first protecting element in the first embodiment.

FIGS. 6 and 7 are sectional views each showing a part of the structure of an element, which may be used for the first protecting element, and is used in the embodiment as mentioned above. In the instance of FIG. 6, a pair of n+ type diffusion regions 28 and 29 are formed in the surface region of the substrate 21, with field oxide film 22 interposed therebetween. Diffusion region 28 is connected to interconnection wire 12. Another diffusion region 29 is connected to ground potential Vss. The element thus arranged operates as an npn bipolar transistor in which n+ diffusion regions 28 and 29 respectively are used for the collector and emitter, and p type substrate 21 for the base.

In the element shown in FIG. 7, a pair of n+ type diffusion regions 30 and 31 are formed in the surface region of the substrate 21, with gate electrode 32 bridging the surface region between those diffusion regions. Diffusion region 30 is connected to interconnection wire 12. Another diffusion region 31 and gate electrode 32 are connected to ground potential Vss. The element thus arranged operates as a npn bipolar transistor in which n+ diffusion regions 30 and 31 are respectively used for the collector and emitter, and p type substrate 21 for the base.

Figure 8:
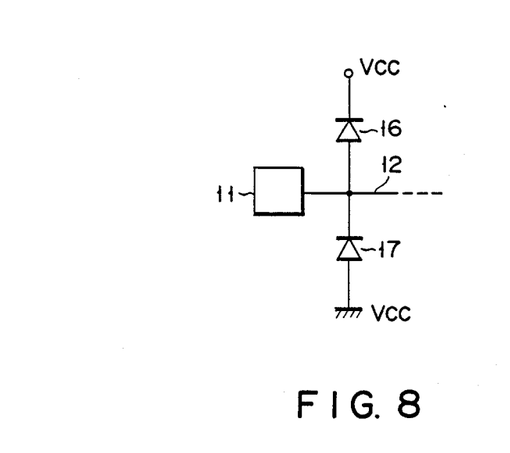
FIGS. 8 to 11 are circuit diagrams showing arrangements of 2nd to 5th embodiments of an input protecting circuit according to the present invention.

FIG. 8 is a circuit diagram showing an arrangement of a second embodiment of an input protecting circuit according to the present invention. In the first embodiment, bipolar transistor 14 is used as the first protecting element which is located near the input pad 11 of interconnection wire 12. In this embodiment, the first protecting element is a pair of diodes, one is pn junction diode 16 inserted between wire 12 and positive power source potential Vcc, to clamp an incoming positive high voltage, and the other is a pn junction diode 17 inserted between wire 12 and ground potential Vss, to clamp an incoming negative high voltage. The second protecting element may be the same pn junction diode as that in the embodiment of FIG. 3.

Figure 9:
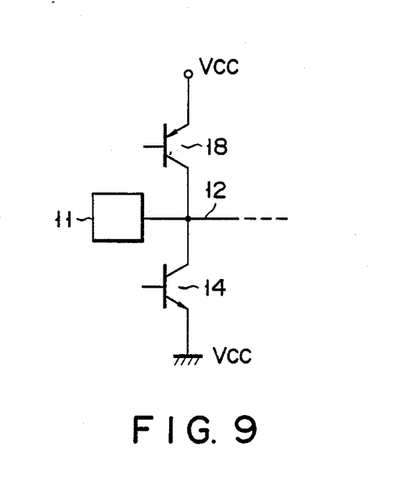

FIG. 9 is a circuit diagram showing an arrangement of a third embodiment of an input protecting circuit according to the present invention. In this embodiment, the protecting element is a pair of transistors, one is npn transistor 14, and the other is pnp transistor 18 as an aluminum field transistor, of which the collector is connected to wire 12, and the emitter to positive power source potential Vcc. Also in this embodiment, the second protecting element may be the same pn junction diode as that in the embodiment of FIG. 3.

In the embodiment of FIG. 9, when a positive voltage due to ESD is applied to input pad 11, it is shunted through the collector-base path of transistor 18 or through the bipolar action of transistor 14. When the applied voltage is negative, it is shunted through the collector-base path of transistor 14 or through the bipolar action of transistor 18.

Figure 10:
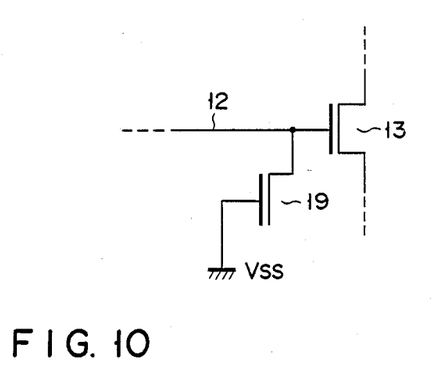

FIG. 10 is a circuit diagram showing an arrangement of a 4th embodiment of an input protecting circuit according to the present invention. While in each of the embodiments as mentioned above, pn junction diode 15 is used for the second protecting element connected to the point of wire 12 near the gate of MOS transistor 13, MOS transistor 19, whose drain and source are both connected to wire 12, is used for the second protecting element in this case. The gate of transistor 19 is connected to ground potential Vss. In the circuit of FIG. 10, the first protecting element may be the bipolar transistor as in the embodiment of FIG. 3.

In the case that the pn junction diode is used for the second protecting element, the clamp voltage is the breakdown voltage of the pn junction. In the case of the MOS transistor being used for the second protecting element, the clamp voltage is the surface breakdown voltage. The surface breakdown voltage of the MOS transistor is lower than the breakdown voltage of the pn junction. Therefore, when MOS transistor 19 is used for the second protecting element, voltage stress applied to the gate oxide film of MOS transistor 13 in the input stage is reduced.

Figure 11:
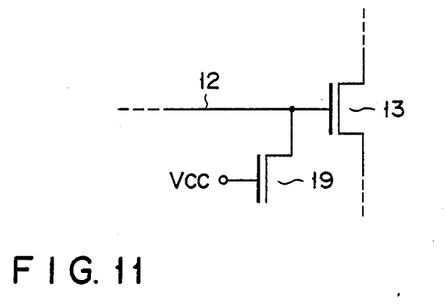

FIG. 11 is a circuit diagram showing an arrangement of a 5th embodiment of an input protecting circuit according to the present invention. In the 5th embodiment, MOS transistor 19 is used for the second protecting element, as in the embodiment of FIG. 10. A difference between the 5th embodiment and the 4th embodiment of FIG. 10, is that the gate of MOS transistor 19 is connected to power source potential Vcc. With this connection, when a voltage stress is applied, the gate of this transistor 19 is equivalently grounded. The resultant surface breakdown voltage is lower than that in a normal operation mode. Thus, various types of elements may be used for the second protecting element.

Figure 12:
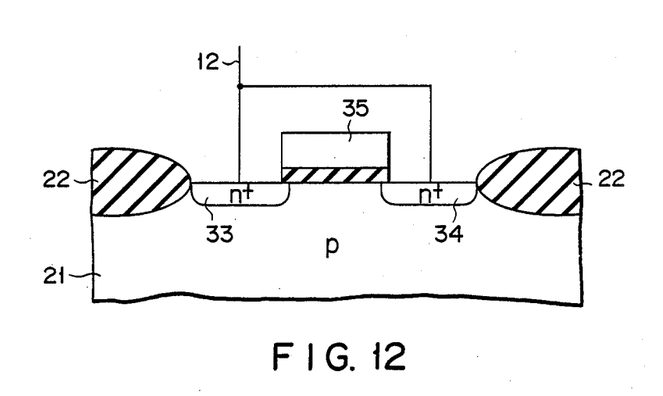
FIG. 12 is a sectional view showing an element used in each of the embodiments of FIGS. 10 and 11.

FIG. 12 is a sectional view showing a structure of MOS transistor 19, which may be used in the embodiments of FIGS. 10 and 11. As shown, a pair of n+ diffusion regions 33 and 34, which is to serve as the source and drain, are formed in the surface region of p type substrate 21 as enclosed by field oxide film 22. These diffusion regions are connected together and to interconnection wire 12. Gate electrode 35 bridges the surface region of substrate 21 between n+ diffusion regions 33 and 34. This gate electrode 35 is coupled with ground potential Vss or power source potential Vcc.

Figure 13:
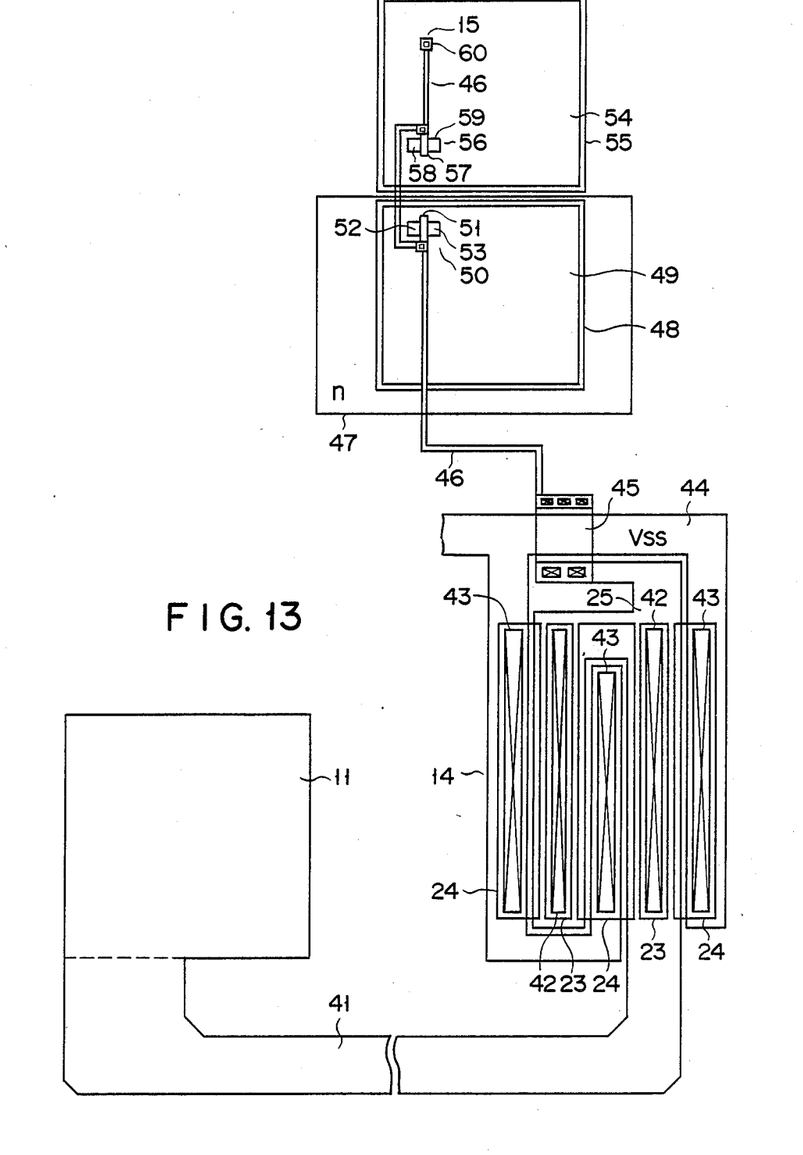
FIG. 13 plan view showing a pattern of a CMOS IC into which an input protecting circuit according to the present invention is applied.

FIG. 13 is a plan view showing a partial pattern of a CMOS-IC in which the input protecting circuit shown in FIG. 3, in which only one input pad and its related circuit are illustrated in detail. Like reference symbols are used for designating like portions in FIG. 3, for simplicity. Input pad 11 made of aluminum is connected to interconnection wire 25 of bipolar transistor 14 as the first protecting element, via interconnection wire 41, which is made of aluminum and a part of wire 12. Bipolar transistor 14 is an aluminum field transistor having a sectional structure as shown in FIG. 4. Wire 25 is connected through a plurality of contact holes 42 respectively to a plurality of n+ diffusion regions 23. A plurality of n+ diffusion regions 24 are connected through a plurality of contact holes 43 to interconnection wire 44, which is made of aluminum and connected to ground potential Vss wire 25 is connected to interconnection wire 46 of the internal circuit, which is made of aluminum, by way of jumper wire 45 as a polysilicon layer, which allows wire 22 to pass above wire 44. This wire 46 is also contained in wire 12.

In n-type well region 47, circuit block 49 is formed while being enclosed by n+ type guard ring region 48. In this circuit block 49, P-channel MOS transistor 50 is formed serving as the MOS transistor in the input stage. Reference numeral 51 designates a polysilicon wire to be the gate of the transistor 50, and 52 and 53, p+ diffusion regions as the source and drain. Interconnection wire 46 is connected to polysilicon wire 51.

Reference numeral 54 designates a circuit block enclosed by p+ type guard ring region 55. N channel MOS transistor 56 as the input stage MOS transistor is formed within this circuit block 54. Reference numeral 57 designates a polysilicon wire to be the gate of the transistor 56, and 58 and 59, p+ diffusion regions as the source and drain. Interconnection wire 46 is connected to polysilicon wire 57. Within the circuit block 54, wire 46 is connected to n+ diffusion region 60 to be the cathode of pn junction diode 15 as the second protecting element. Diode 15 is enclosed by guard ring region 55 in the circuit block 54 containing the input stage MOS transistor 56.

A chip area of the diffusion region 60 serving as the cathode of pn junction diode 15, may be very small, 10 $\mu$m, for example. Therefore, if this diode 15 is formed near MOS transistor 56, it causes little causes latch-up phenomenon in the internal circuit.

Figure 14:
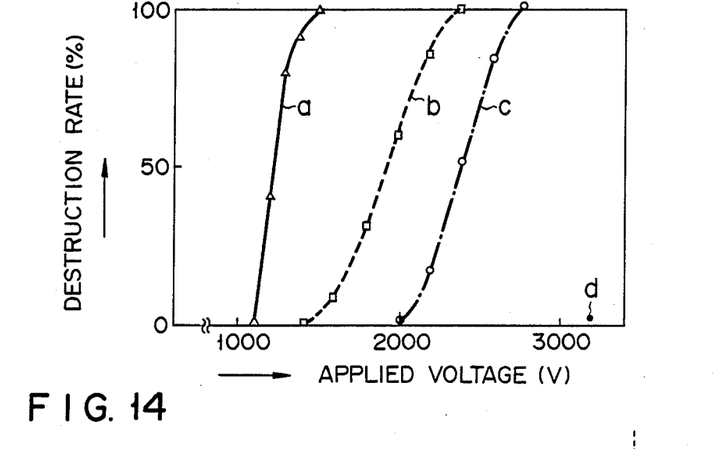
FIG. 14 is a graph comparatively showing element destruction rates of the input protecting circuits of the above and art.

FIG. 14 shows a graph comparatively showing destruction rates (%) of the elements when a high voltage is applied to the input pad in each of the above-mentioned embodiments, and in the conventional input protecting circuit. In the graph, curve "a" shows a variation of destruction rate of the conventional protecting circuit shown in FIG. 1, which is constructed as follows: a polysilicon resistor of 200-ohm and 20 $\mu$m in width is inserted in the interconnection wire, the inductance L of the wire is 20 nH, the protecting element is an aluminum field transistor of which the channel width is 500 $\mu$m and the interval between the diffusion regions is 24 $\mu$m. Destruction rate variation curve "b" is obtained when the protecting element 52 in the conventional protecting circuit is an aluminum field transistor of which the channel width is 500 $\mu$m, and the interval between the diffusion regions is 2.4 $\mu$m. In this case, the portion that is is destroyed is the gate oxide film of the MOS transistor in the input stage. The breakdown voltage is ±1400 V, and low next to curve "a". Destruction rate variation curve "c" is obtained when the protecting element 52 in the conventional protecting circuit uses an aluminum field transistor of which the channel width is 300 $\mu$m, and the interval between the diffusion regions is 2.4 $\mu$m, and another aluminum field transistor of which the channel width is 100 $\mu$m, and the interval between the diffusion regions is 2.4 $\mu$m, and a further diffusion resistor laid between these transistors. Also in this case, the portion that is destroyed is the gate oxide film of the MOS transistor in the input stage. The breakdown voltage is ±2000 V, and low next to curve "b".

Curve "c" shows a destruction rate variation of an input protecting circuit according to the present invention in which the second protecting element is the MOS transistor 19 shown in FIG. 11. The channel width and the distance between the diffusion regions of the bipolar transistor 14 as the first protecting element are respectively 500 μm and 2.4 μm, the same as those in the cases of curves "a" and "b". It was confirmed that the breakdown voltage is ±3000 V or more. Thus, the ESD breakdown voltage is remarkably improved.

Figure 15:
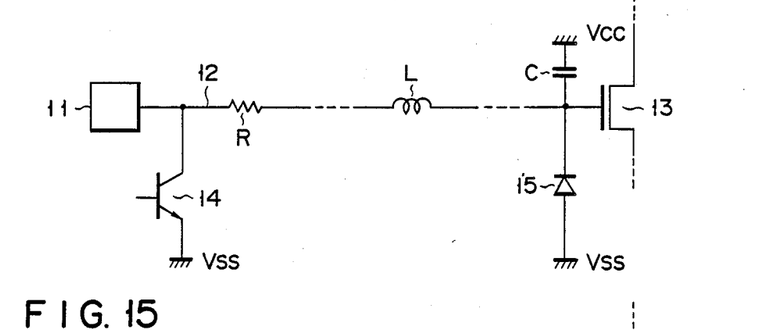
FIGS. 15 to 16 are circuit diagrams showing arrangements of 6th and 7th embodiments of an input protecting circuit according to the present invention.

FIG. 15 is a circuit diagram showing a 6th embodiment of an input protecting circuit according to the present invention. In the present embodiment, resistor R of 200-ohm or more, for example, is inserted between bipolar transistor 14 as the first protecting element and pn junction diode 15 as the second protecting element. This resistor R and a parasitic capacitor C in the vicinity of the gate of the MOS transistor 13 in the input stage, cooperate to form a CR filter. This filter functions to absorb the potential oscillation in wire 12.

Figure 16:
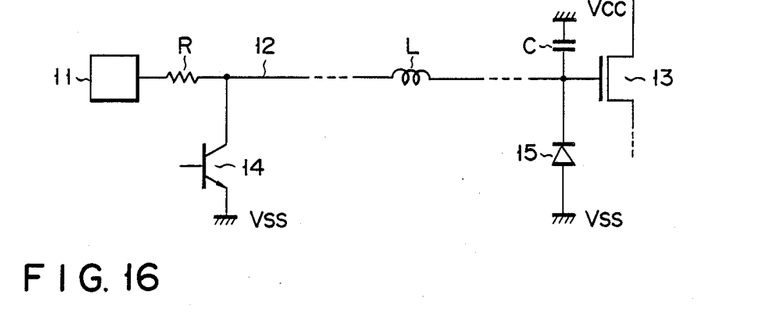

FIG. 16 is a circuit diagram showing a 7th embodiment of an input protecting circuit according to the present invention. In this embodiment, resistor R of 200-ohm or more, for example, is inserted between input pad 11 and bipolar transistor 14 as the first protecting element. The resistor R and a parasitic capacitor C in the vicinity of the gate of the MOS transistor 13 in the input stage, also cooperate to form a CR filter. This filter functions to absorb the potential oscillation in wire 12.

As described above, in the input protecting circuit according to the present invention, the protecting element is additionally provided near the gate of the input stage MOS transistor. This feature attains ±3000 V or more of the ESD breakdown voltage. This figure is much higher than that of the conventional protecting circuit.

Further, the effect by the present invention may be obtained even if the chip area required for the protecting element near the gate of the input stage MOS transistor is very small. Therefore, there is no degradation of the latch-up performance.

What is claimed is:

1. An input protecting circuit in use with a MOS semiconductor device having an input stage, comprising:
    an input pad;
    a MOS transistor in the input stage of the MOS semiconductor device, the gate of which receives a signal from said input pad;
    a wire interconnecting said input pad and the gate of said MOS transistor in said input stage;
    a first protecting element provided near said input pad and connected at one end to said interconnecting wire; and
    a second protecting element provided near the gate of said MOS transistor and connected at one end to said interconnecting wire, said second protecting element being formed in a circuit block which is enclosed by a guard ring region and contains said MOS transistor of the input stage formed therein.

2. An input protecting circuit according to claim 1, wherein a resistor is inserted in series in said wire.

3. An input protecting circuit according to claim 1, wherein said first protecting element is one bipolar transistor.

4. An input protecting circuit according to claim 1, wherein said first protecting element includes a pair of diodes.

5. An input protecting circuit according to claim 1, wherein said first protecting element includes a pair of bipolar transistors.

6. An input protecting circuit according to claim 1, wherein said second protecting element includes a diode.

7. An input protecting circuit according to claim 1, wherein said second protecting element includes a second MOS transistor having a source and drain connected to said wire.

8. An input protecting circuit according to claim 7, wherein a gate of said second MOS transistor is grounded.

9. An input protecting circuit according to claim 7, wherein a gate of said second MOS transistor is connected to a power source potential.

10. An input protecting circuit in use with a MOS semiconductor device, having an input stage, comprising:
    an input pad;
    a MOS transistor in the input stage of the MOS semiconductor device, a gate of which receives a signal from said input pad;
    a wire interconnecting said input pad and the gate of said MOS transistor in said input stage;
    a first protecting element provided near said input pad and connected at one end to said interconnecting wire, said first protecting element releasing most of certain energy applied to said input pad due to high voltage noise down to a reference potential level; and
    a second protecting element provided near the gate of said MOS transistor and connected at one end to said interconnecting wire, said second protecting element being formed in a circuit block which is enclosed by a guard ring region and contains said MOS transistor of the input stage formed therein, said second protecting element releasing a very small amount of energy applied to said input pad due to high voltage noise down to a reference potential level.

11. An input protecting circuit according to claim 10, wherein said first protecting element includes a bipolar transistor.

12. An input protecting circuit according to claim 10, wherein said first protecting element includes a pair of diodes.

13. An input protecting circuit according to claim 10, wherein said first protecting element includes a pair of bipolar transistors.

14. An input protecting circuit according to claim 10, wherein said second protecting element includes a diode.

15. An input protecting circuit according to claim 10, wherein said second protecting element includes a second MOS transistor having a source and a drain connected to said wire.

16. An input protecting circuit according to claim 15, wherein said second MOS transistor has a gate which is grounded.

17. An input protecting circuit according to claim 15, wherein said second MOS transistor has a gate which is connected to a power source potential.

18. An input protecting circuit according to claim 10, further including a resistor is inserted in series in said wire.

* * * * *